(12) United States Patent
Chong et al.

(10) Patent No.: US 12,565,417 B2
(45) Date of Patent: Mar. 3, 2026

(54) MEMS DEVICE AND MANUFACTURING METHOD THEREOF

(71) Applicant: AAC Technologies Pte. Ltd., Singapore (SG)

(72) Inventors: Houming Chong, Johor (MY); Veronica Tan, Singapore (SG); Zaixiang Pua, Singapore (SG); Kahkeen Lai, Singapore (SG); Zhan Zhan, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 358 days.

(21) Appl. No.: 18/298,311

(22) Filed: Apr. 10, 2023

(65) Prior Publication Data

US 2024/0336474 A1 Oct. 10, 2024

(51) Int. Cl.
*B81B 3/00* (2006.01)
*B81C 1/00* (2006.01)
*G01C 19/5733* (2012.01)
*G01C 19/5769* (2012.01)

(52) U.S. Cl.
CPC ........ *B81B 3/0037* (2013.01); *B81C 1/00166* (2013.01); *G01C 19/5733* (2013.01); *G01C 19/5769* (2013.01); *B81B 2201/0242* (2013.01); *B81B 2203/0136* (2013.01); *B81B 2203/04* (2013.01); *B81C 2201/0105* (2013.01); *B81C 2201/0132* (2013.01); *B81C 2203/0109* (2013.01)

(58) Field of Classification Search
None
See application file for complete search history.

(56) References Cited

U.S. PATENT DOCUMENTS

| | | | | |
|---|---|---|---|---|
| 5,756,901 A | * | 5/1998 | Kurle | B81B 7/007 |
| | | | | 73/514.01 |
| 2007/0042521 A1 | * | 2/2007 | Yama | B81C 1/00333 |
| | | | | 438/48 |
| 2013/0042686 A1 | * | 2/2013 | Lin | G01C 19/5783 |
| | | | | 73/514.16 |
| 2016/0368763 A1 | * | 12/2016 | Gonska | B81B 7/02 |

* cited by examiner

*Primary Examiner* — Mark A Shabman
(74) *Attorney, Agent, or Firm* — Wiersch Law Group

(57) ABSTRACT

A MEMS device and a method for manufacturing the MEMS device are provided. The MEMS device includes a cap sheet and a device sheet. The device sheet includes a silicon substrate, at least two device structure layers, and at least one conductive structure layer, and each two adjacent device structure layers are coupled via a corresponding conductive structure layer. The device sheet defines a functional cavity having a first region, a second region, and a third region. The at least two device structure layers and the at least one conductive structure layer each are across the first region, the second region, and the third region, and the at least two device structure layers and the at least one conductive structure layer cooperatively form a first movable structure in the first region, define an anchor point in the second region, and form a second movable structure in the third region.

14 Claims, 5 Drawing Sheets

200

204

205

210(213)

210(211)

212

206

207

210(213)

210(211)

212

210(213)

212

210(211)

MEMS DEVICE AND MANUFACTURING METHOD THEREOF

TECHNICAL FIELD

The various embodiments described in this document relate in general to semiconductor manufacturing, and more specifically to a micro electro mechanical system (MEMS) device and a manufacturing method thereof.

BACKGROUND

Inertial sensors based on MEMS technology have been widely used due to their simple structure, good compatibility with microelectronics manufacturing process, and mass production. However, a size of the inertial sensor is a challenge for current MEMS device fabrication. In some cases, the performance of the inertial sensor decreases as the size of the inertial sensor is reduced because the contact area of the movable structure is reduced.

Therefore, it is desired to reduce the size and manufacturing cost of the inertial sensor while improving precision of the inertial sensor.

SUMMARY

Embodiments of the present disclosure provide a MEMS device and a method for manufacturing the MEMS device, which can reduce the size and manufacturing cost of the MEMS device, and improve performance of the MEMS device.

In some embodiments, a micro electro mechanical system (MEMS) device is provided. The MEMS device includes a cap sheet defining a recess; and a device sheet bonded with the cap sheet and defining a functional cavity directly facing the recess. The device sheet includes a silicon substrate and a functional portion received in the functional cavity, wherein the functional portion includes at least two device structure layers and at least one conductive structure layer that are stacked in a first direction perpendicular to a surface of the silicon substrate, and wherein each two adjacent device structure layers of the at least two device structure layers are coupled via a corresponding conductive structure layer to form electrical paths between the each two adjacent device structure layers and the corresponding conductive structure layer. The functional cavity has a first region, a second region, and a third region. The at least two device structure layers and the at least one conductive structure layer each are across the first region, the second region, and the third region, and the at least two device structure layers and the at least one conductive structure layer cooperatively form a first movable structure in the first region, define an anchor point in the second region, and form a second movable structure in the third region; and the first movable structure is configured to sense an angular velocity around Z-axis and the second movable structure is configured to sense an angular velocity around X-axis and Y-axis.

In some embodiments, the at least two device structure layers and the at least one conductive structure layer in the second region are connected with one another; and the anchor point is disposed at an end of the first movable structure and configured to support the first movable structure and connect the first movable structure to the electrical paths.

In some embodiments, each layer of the at least two device structure layers and the at least one conductive structure layer in the first region includes two comb-like structures, wherein one of the two comb-like structures includes fixed beams, another of the two comb-like structures includes flexible beams, and beams of the two comb-like structures are alternately arranged, forming a forked finger arrangement; the two comb-like structures of a respective device structure layer in the first region are separated from the two comb-like structures of a corresponding conductive structure layer in the first region, and the two comb-like structures of a device structure layer close to the silicon substrate are separated from the dielectric layer by a first space.

In some embodiments, the at least two device structure layers and the at least one conductive structure layer in the third region are two comb-like structures, wherein one of the two comb-like structures includes fixed beams, another of the two comb-like structures includes flexible beams, and beams of the two comb-like structures are alternately arranged, forming a forked finger arrangement; and the second movable structure has a thickness equal to a difference between a total thickness of the at least two device structure layers and the at least one conductive structure layer and a thickness of the first space in the first direction.

In some embodiments, there is an uniform opening defined between each two adjacent beams of the two comb-like structures.

In some embodiments, the at least one conductive structure layer is made from at least one of polysilicon and metal, and the at least two device structure layers each are made from Epitaxy-polysilicon.

In some embodiments, the at least two device structure layers include a first device structure layer close to the silicon substrate, wherein there is a dielectric layer sandwiched between the first device structure layer and the silicon substrate, and the dielectric layer is made from at least one of a silicon oxide material and a silicon nitride material.

In some embodiments, the at least two device structure layers further include a N-th device structure layer close to the cap sheet, and wherein the first device structure layer has a thickness in a range of 10 um to 40 um, and the N-th device structure layer has a thickness in a range of 2 um to 10 um.

In some embodiments, the cap sheet includes a first metal layer outside the recess and facing the device sheet, and the device sheet further includes a second metal layer, and wherein the cap sheet and the device sheet are bonded together via the first metal layer and the second metal layer.

In some embodiments, the first metal layer is made from at least one of germanium (Ge), aluminium (Al), and aurum (Au), and the second metal layer is made from at least one of Ge, Al, and Au.

In some embodiments, the functional portion is configured to generate electrical signals and the second metal layer is further configured to output electrical signals generated.

In some embodiments, a method for manufacturing the MEMS device described in above embodiments is provided. The method includes forming the cap sheet; forming the device sheet; and bonding the cap sheet and the device sheet. Forming the device sheet includes: providing the silicon substrate; and forming the functional portion in the functional cavity by stacking up the at least two device structure layers via the at least one conductive structure layer in the first direction perpendicular to the surface of the silicon substrate, wherein the at least two device structure layers include a first device structure layer close to the silicon substrate and a N-th device structure layer close to the cap sheet. Forming the functional portion comprises: depositing a first sacrificial layer on a part of the surface of the silicon substrate and patterning the first sacrificial layer in the second region to define the anchor point for the functional portion, and depositing the first device structure layer on a surface of the first sacrificial layer and patterning the first device structure layer in the first region to form a part of the first movable structure in the first region; depositing a second sacrificial layer on a part of a surface of the first device structure layer in the first region and the second region and patterning the second sacrificial layer in the second region to define the anchor point for the function portion, and depositing a first conductive structure layer on a surface of the second sacrificial layer and another part of the surface of the first device structure layer and patterning the first conductive structure layer in the first region to form another part of the first movable structure in the first region; repeating device-structure-layer deposition and patterning and conductive-structure-layer deposition and patterning, until the N-th device structure layer is deposited and patterned; performing a deep reactive ion etching (DRIE) process on the at least two device structure layers and the at least one conductive structure layer in the third region to form the second movable structure; and removing all sacrificial layers including the first sacrificial layer and the second sacrificial layer by using vapor phase hydrofluoric acid (VHF).

In some embodiments, performing the DRIE process on the at least two device structure layers and the at least one conductive structure layer in the third region to form the second movable structure includes: forming two comb-like structures, wherein one of the two comb-like structures includes fixed beams, another of the two comb-like structures includes flexible beams, and beams of the two comb-like structures are alternately arranged, forming a forked finger arrangement.

In some embodiments, the method further includes the following, before depositing the first sacrificial layer: depositing a dielectric layer on the surface of the silicon substrate by using at least one of a silicon oxide material and a silicon nitride material.

In some embodiments, the at least two device structure layers are deposited by adopting Epitaxy-polysilicon and the at least one conductive structure layer is deposited by adopting at least one of following materials: polysilicon and metal.

In some embodiments, depositing the first device structure layer includes depositing the first device structure layer of a thickness in a range of 10 um to 40 um, and depositing the N-th device structure layer includes depositing the N-th device structure layer of a thickness in a range of 2 um to 10 um.

In some embodiments, the method further includes the following, after forming the functional portion: forming a second metal layer on a surface of the N-th device structure layer away from the silicon substrate, wherein the second metal layer is configured for forming eutectic bonding with a first metal layer on the cap sheet and forming electrical connection with external circuits.

BRIEF DESCRIPTION OF THE DRAWINGS

The embodiments of the present disclosure are illustrated by way of example and not limitation in the figures of the accompanying drawings, in which like references may indicate similar elements.

Figure 1:
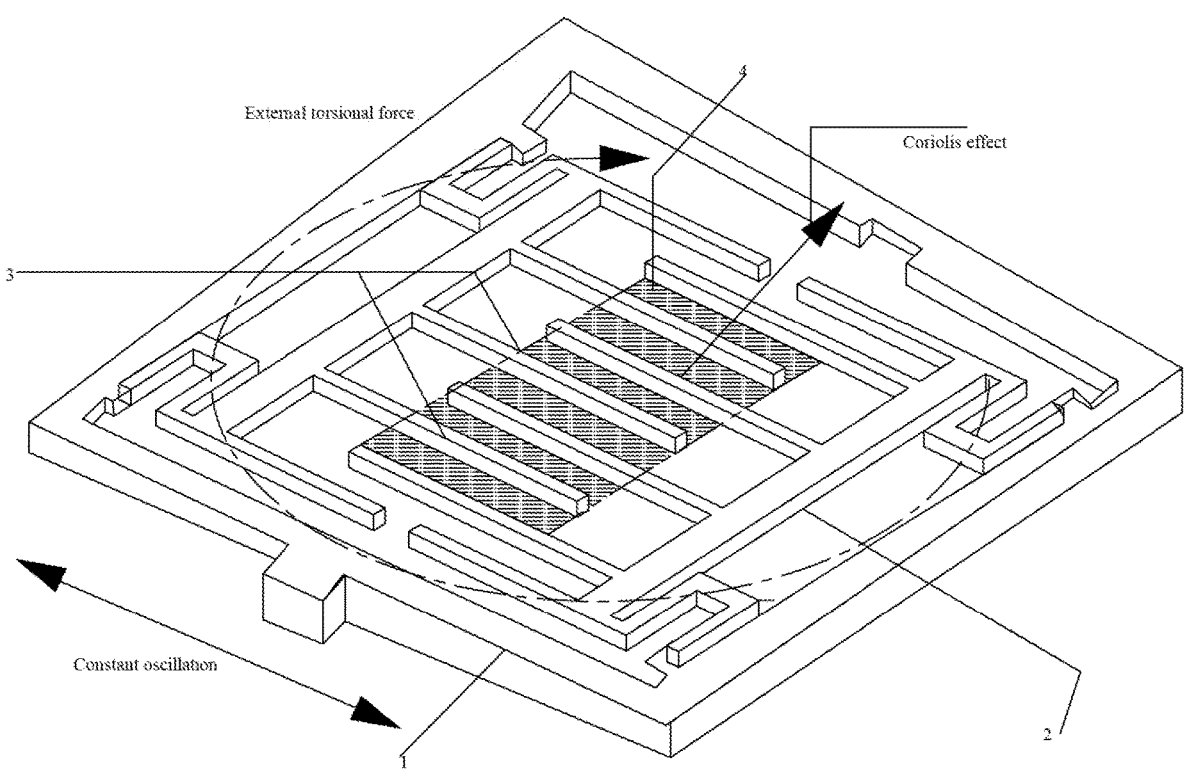
FIG. 1 illustrates working principle of a MEMS gyroscope according to an embodiment of the present disclosure.

Reference numerals in figures are illustrated as follows: 1: drive structure; 2: detection structure; 3: comb-like structures; 4: distance between combs; 100: cap sheet; 103: recess; 200: device sheet; 208: functional cavity; 207: silicon substrate; 210: device structure layer; 211: first device structure layer; 213: N-th device structure layer; 212: conductive structure layer; 209: functional portion; 201: first region, 202: second region; 203: third region; 2011: first movable structure; 2021: anchor point; 2031: second movable structure; 31: first comb-like structure; 32: second comb-like structure; 206: dielectric layer; 310: sacrificial layer; first space 320.

DETAILED DESCRIPTION OF THE EMBODIMENTS

To better understand technical solutions of the present disclosure, embodiments of the present disclosure are described in detail below with reference to the accompanying drawings.

It is to be noted that the described embodiments are only part of embodiments and not all embodiments of the present disclosure. Based on the embodiments in the present disclosure, all other embodiments obtained without creative effort by those of ordinary skill in the art fall within the scope of protection of the present disclosure.

Terms used in embodiments of the present disclosure are for the purpose of describing specific embodiments only and are not intended to limit the present disclosure. Singular forms "an", "said", and "the" as used in embodiments of the present disclosure and in the appended claims are also intended to include a plurality of forms, unless the context clearly dictates otherwise.

It shall be understood that the term "and/or" used herein is merely an association relationship that describes an associated object, indicating that there can be three relationships. For example, the expression "A and/or B" may include three cases: A exists alone, A and B exist at the same time, and B exists alone. In addition, the character "/" herein generally indicates that related objects are a kind of "or" relationship.

It is to be noted that the orientation words "up", "down", "left", "right", and the like described in the embodiments of the present disclosure are described from the angles shown in the drawings and should not be understood as limiting the embodiments of the present disclosure. Furthermore, in the context, it is to be understood that when a component is referred to as being connected "above/up" or "below/lower" of another component, the component can not only be directly connected to the "above/up" or "below/lower" of the another component, but can also be indirectly connected to the "above/up" or "below/lower" of the another component through a middle component.

Micro-electro-mechanical system (MEMS) devices refer to high-tech devices with a size of several millimeters or even smaller, and a size of an internal structure of this device is generally on the micron scale or even nanometer scale. The MEMS device generally includes suspended structures (also known as the movable structure suspended through the anchor point at the end of the movable structure in the following text), which are fabricated by a sacrificial-layer removal process.

The MEMS device generally includes MEMS acoustic sensors, MEMS pressure sensors, and MEMS inertial sensors, and so on. The MEMS inertial sensors generally include a MEMS accelerometer and a MEMS gyroscope. The MEMS gyroscope is mainly used to measure an angular velocity of a carrier. The MEMS gyroscope may include a three-axis gyroscope of X-axis, Y-axis, and Z-axis.

FIG. 1 illustrates working principle of a MEMS gyroscope according to embodiments of the present disclosure. As illustrated in FIG. 1, the MEMS gyroscope includes a drive structure 1 and a detection structure 2. The drive structure 1 is configured to generate drive signals and the detection structure 2 is configured to detect angular velocity of the carrier according to the drive signals generated. The detection structure 2 includes comb-like structures 3. During rotation, an outer frame of the MEMS gyroscope swings back and forth. When the carrier rotates, a part of comb-like structures 3 of the MEMS gyroscope is deflected, which may lead to change of a distance 4 between combs of the comb-like structures, thereby leading to changing in capacitance. Therefore, the angular velocity of the carrier can be measured.

The comb-like structure is a critical component of the MEMS gyroscope that allows the device integrated with the MEMS gyroscope to measure the angular velocity of the device. To improve the integration of the MEMS gyroscope into portable apparatus, the size of the MEMS gyroscope needs to be enough reduced. However, by reducing the size of the MEMS gyroscope, surface area of some of the comb-like structures may be sacrificed or reduced, which may lead to reduction of the overall sensitivity of the device, and lower accuracy and precision in detecting angular velocity.

Therefore, in order to reduce the size of the MEMS gyroscope but without impact on the performance of the MEMS gyroscope, embodiments of the present disclosure provide a MEMS device and a manufacturing method thereof, to stack up device structures to form a larger area of comb-like structures, so as to reduce the size of the MEMS device and improve the integration of the MEMS device into portable apparatus.

According to embodiments of the present disclosure, a MEMS device is provided. The MEMS device includes a device sheet defining a functional cavity. The device sheet includes a silicon substrate, and at least two device structure layers and at least one conductive structure layer that are stacked in a first direction perpendicular to a surface of the silicon substrate. Each two adjacent device structure layers of the at least two device structure layers are coupled via a corresponding conductive structure layer to form electrical paths between each two adjacent device structure layers and the corresponding conductive structure layer. The device sheet includes a functional portion received in the functional cavity, and the functional portion has at least one first region, at least one second region, and a third region. Each layer of the at least two device structure layers and the at least one conductive structure layer is across each first region, each second region, and the third region. The at least two device structure layers and the at least one conductive structure layer cooperatively form at least one first movable structure in the at least one first region that is respectively in one-to-one correspondence with the at least one first movable structure, define at least one anchor point in the at least one second region that is respectively in one-to-one correspondence with the at least one anchor point, and form a second movable structure in the third region.

Since the MEMS device includes the first movable structure in the first region, the anchor point in the second region, and the second movable structure in the third region by stacking up the at least two device structure layers via the at least one conductive structure layer, a larger sensing area of in-plane electrodes is formed. The in-plane electrodes form a parallel-plate capacitor, where the movable electrode of the in-plane electrodes acts as one electrode and a fixed reference electrode of the in-plane electrodes acts as the other electrode. The change of the distance between the electrodes results in a change in the capacitance, such that the angular velocity around X-axis and Y-axis and the angular velocity around Z-axis can be sensed. Therefore, by combination of the multi-layer device structure layers, not only the detection areas of the movable structures of the MEMS device are increased, but also the size and the manufacturing cost of the MEMS device are reduced.

Figure 2:
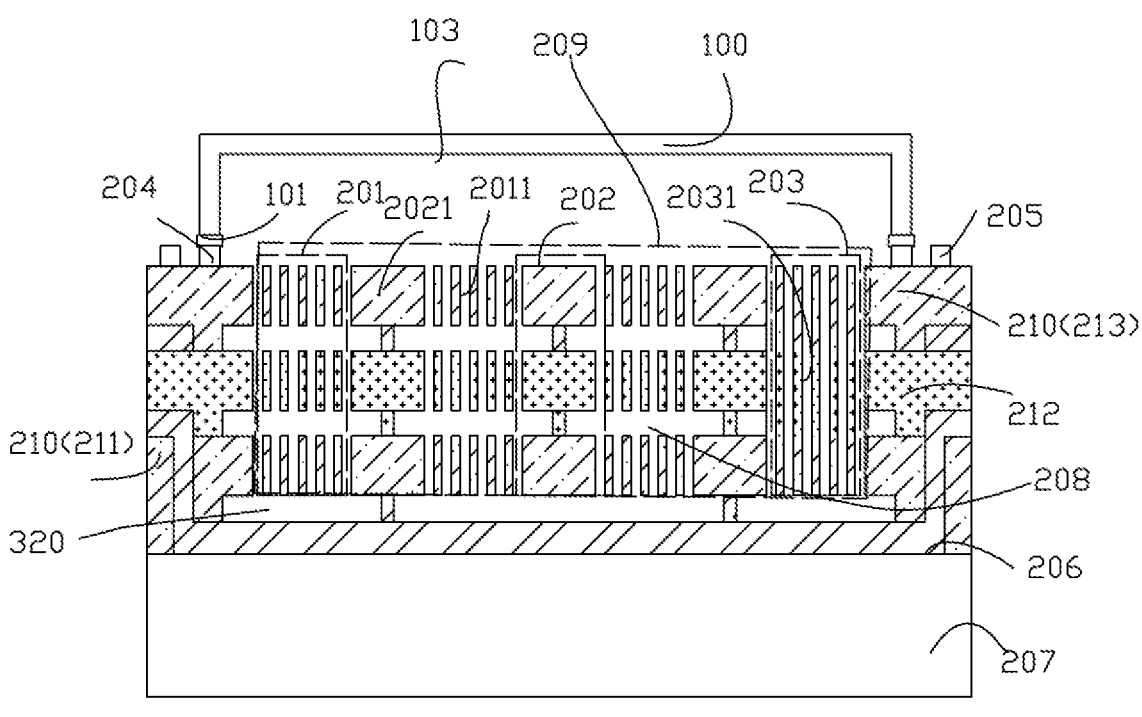
FIG. 2 is a schematic view of a MEMS device according to an embodiment of the present disclosure.

FIG. 2 is a schematic view of a MEMS device according to embodiments of the present disclosure. As shown in FIG. 2, the MEMS device includes a cap sheet 100 defining a recess 103 and a device sheet 200 bonded with the cap sheet 100. The device sheet 200 defines a functional cavity 208 directly facing the recess 103.

Since the MEMS device needs to be operated in a sealed environment, a cover body (e.g., the cap sheet 100 described in the present disclosure) is bonded with the device sheet 200, so that the corresponding movable structures of the MEMS device are sealed in the cavity defined by the silicon substrate 1 and the cover body. The cap device 100 is generally a silicon cap.

The device sheet 200 includes a silicon substrate 207 a functional portion 209 received in the functional cavity 208. The functional portion 209 includes at least two device structure layers 210 and at least one conductive structure layer 212. The at least two device structure layers 210 include a first device structure layer 211 close to the silicon substrate 207 and a N-th device structure layer 213 close to the cap sheet 100. N is a positive integer greater than or equal to 2. The at least two device structure layers 210 and the at least one conductive structure layer 212 are stacked in a first direction perpendicular to a surface of the silicon substrate 207. Each two adjacent device structure layers 210 of the at least two device structure layers 210 are coupled via a corresponding conductive structure layer 212 to form electrical paths between each two adjacent device structure layers 210 and the corresponding conductive structure layer 212. In other words, each conductive structure layer 212 is used for connecting adjacent device structure layers, such that a relatively large movable structure is formed.

The functional cavity 208 has a first region 201, a second region 202, and a third region 203.

The at least two device structure layers 210 and the at least one conductive structure layer 212 each are across the first region 201, the second region 202, and the third region 203. The at least two device structure layers 210 and the at least one conductive structure layer 212 cooperatively form a first movable structure 2011 in the first region 201, define an anchor point 2021 in the second region 202, and form a second movable structure 2031 in the third region 203. The first movable structure is configured to sense an angular velocity around Z-axis and the second movable structure is configured to sense an angular velocity around X-axis and Y-axis.

As can be seen, since the functional portion 209 of the MEMS device includes the first movable structure 2011, the anchor point 2021, and the second movable structure 2031, where the first movable structure 2011 is cooperatively formed by the at least two device structure layers 210 and the at least one conductive structure layer 212 in the first region 201, the anchor point 2021 is cooperatively formed by the at least two device structure layers 210 and the at least one conductive structure layer 212 in the second region 202, and the second movable structure 2031 is cooperatively formed by the at least two device structure layers 210 and the at least one conductive structure layer 212 in the third region 203, the movable structure of the MEMS device provided in the present disclosure have a relatively large contact area, such that the overall sensitivity of the MEMS device can be reduced, and accuracy and precision in detecting angular velocity around X-axis, Y-axis, and Z-axis can be improved.

It shall be understood that there is no restriction on the number of the device structure layers 210 and the conductive structure layer 212. Although FIG. 2 merely illustrates two device structure layers 210 and one conductive structure layer 212, there may be three or more device structure layers stacked, as long as each two adjacent device structure layers 210 are coupled via a corresponding conductive structure layer 212.

In some embodiments, each layer of the at least two device structure layers 210 and the at least one conductive structure layer 212 in the first region 201 includes two comb-like structures, where one of the two comb-like structures includes fixed beams (combs, springs), another of the two comb-like structures includes flexible beams, and beams of the two comb-like structures are alternately arranged, forming a forked finger arrangement.

Figure 3:
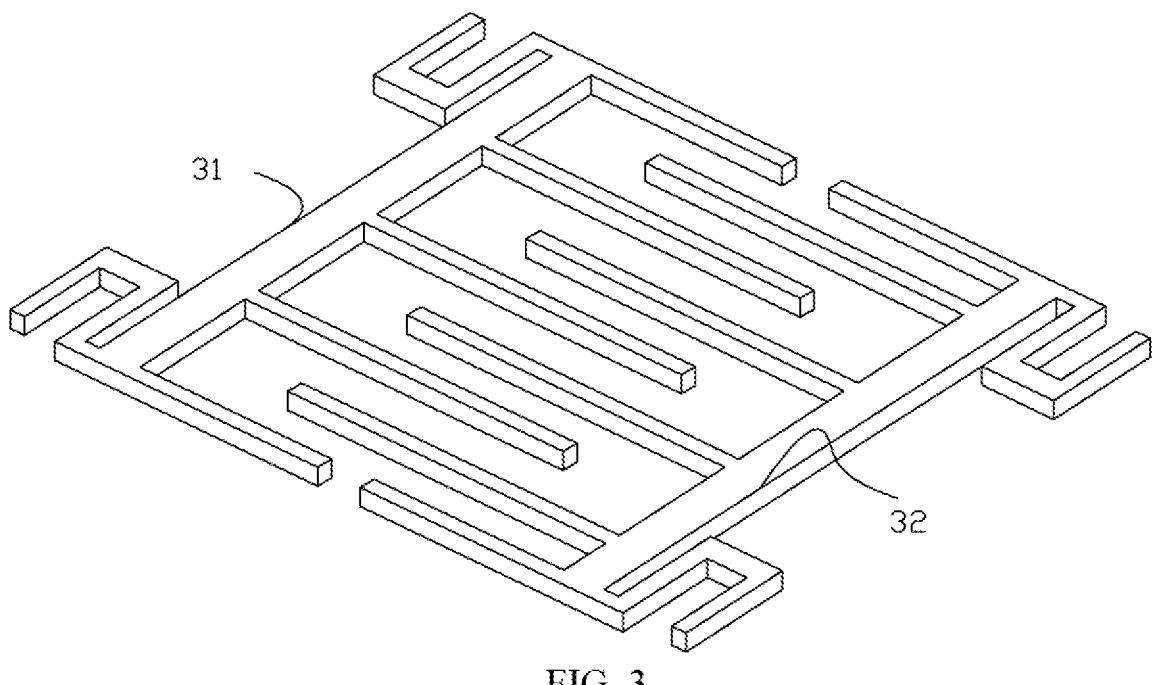
FIG. 3 is a schematic view of two comb-like structures of the MEMS device in FIG. 2.

In embodiments of the present disclosure, as illustrated in FIG. 3, the device structure layer 210 in the first region 201 (or the conductive structure layer 212 in the first region 201) includes two comb-like structures including a first comb-like structure 31 and a second comb-like structure 32, where the first comb-like structure 31 includes flexible beams (combs), and the second comb-like structure 32 also includes flexible beams (combs), beams of the first comb-like structure 31 and the second comb-like structure 32 are alternately arranged, forming a forked finger arrangement.

During operation, for example, the beams of the first comb-like structure 31 can be used as fixed reference electrodes, and the beams of the second comb-like structure 32 can be used as movable electrodes, such that the fixed reference electrode and the movable electrode form a parallel-plate capacitor. When the MEMS device is driven to rotate, a distance (see also the distance between combs as illustrated in FIG. 1) between the fixed reference electrode and the movable electrode is changed, and a change of the distance between the fixed reference electrode and the movable electrode may lead to change in the capacitance between the fixed reference electrode and the movable electrode. Therefore, the angular velocity of movement of an object can be detected according to the change in the capacitance of the parallel-plate capacitor.

In some embodiments, the two comb-like structures of a respective device structure layer in the first region are separated from the two comb-like structures of a corresponding conductive structure layer in the first region, and the two comb-like structures of the first device structure layer 211 are separated from the dielectric layer 206 by a first space 320.

It shall be understood that the first movable structure is configured to sense the angular velocity around Z-axis, since the first movable structure is cooperatively formed by the at least two device structure layers and the at least one conductive structure layer in the first region, the first movable structure includes a multi-layer structure. Therefore, to provide oscillation space between layers, gaps need to be reversed between adjacent layers. For example, as illustrated in FIG. 2 and FIG. 3, there is a gap defined between the first device structure layer 211 and the adjacent conductive structure layer 212 in the first region, and there is also a gap defined between the conductive structure layer 212 and the adjacent N-th device structure layer 213 in the first region. Therefore, during operation, with the electrical path in between the conductive structure layer 212 and the adjacent first device structure layer 211 or the adjacent N-th device structure layer 213, the gap between the conductive structure layer 212 and the adjacent first device structure layer 211 and the adjacent N-th device structure layer 213 is reduced, such that the angular velocity around Z-axis can be detected accurately, i.e., the sensitivity of the MEMS device in Z-axis can be increased.

It is to be noted that both the first device structure layer and the N-th device structure layer have the same function. The N-th device structure layer is formed by stacking device structures on the top of each other, rather than depositing both device layers in a single layer, such that the die size can be reduced.

In some embodiments, the at least two device structure layers and the at least one conductive structure layer in the second region are connected with one another, and the anchor point is disposed at an end of the first movable structure and configured to support the first movable structure and connect the first movable structure to the electrical paths.

It shall be understood that the first movable structure is a structure suspended using mechanical supports, such as beams or springs. Therefore, to enable the movable structure to connect the electrical path and support the movable structure, the anchor point provided at the end of the movable structure.

In some embodiments, the second movable structure 2031 includes two comb-like structures, i.e., the at least two device structure layers 210 and the at least one conductive structure layer 212 in the third region 203 are two comb-like structures, where one of the two comb-like structures includes fixed beams, another of the two comb-like structures includes flexible beams, and beams of the two comb-like structures are alternately arranged, forming a forked finger arrangement. In the first direction, the second movable structure 2031 has a thickness equal to a difference between a total thickness of the at least two device structure layers 210 and the at least one conductive structure layer 212 and a thickness of the first space 320.

Similar to the first movable structure, the second movable structure is also suspended using mechanical supports, such as beams or springs. The second movable structure is also connected to the electrical path through the anchor point at the end of the movable structure.

In addition, as illustrated in FIG. 2, the second movable structure 2031 is configured to sense the angular velocity around X-axis and Y-axis, since the second movable structure is cooperatively formed by stacking up the at least two device structure layers via the at least one conductive structure layer in the third region, and there is no gap defined between any two adjacent layers, the second movable structure may have a thickness in the first direction substantially equal to a total thickness of the at least two device structure layers and the at least one conductive structure layer. It shall be understood that to enable the second movable structure 2031 to sense the angular velocity around X-axis and Y-axis, a gap (e.g., the first space 320) needs to be defined between the second movable structure 2031 and the dielectric layer 206. In other words, each electrode of the second movable structure is relative thick (large), the thick electrodes (fixed reference electrodes and movable electrodes) have relatively high in-plane sensitivity, since they have larger surface areas (their placement relative to the movable structure), such that the second movable structure may provide a relatively strong signal, so as to accurately measure the angular motion around the X-axis and the Y-axis. Therefore, with aid of the second movable structure in the present disclosure, the sensitivity of the MEMS device in the X-axis and the Y-axis can be improved.

In some embodiments, there is an uniform opening defined between each two adjacent beams of the two comb-like structures.

The uniform opening between each two adjacent beams of the two comb-like structures means that the electrodes in the second movable structure have uniform profile. The uniform thick electrodes may have a relative high sensitivity because the detected distance between the adjacent electrodes is accurate.

In some embodiments, there is a dielectric layer 206 sandwiched between the first device structure layer 211 and the silicon substrate 207, and the dielectric layer 206 is made from at least one of a silicon oxide material and a silicon nitride material.

It is to be noted that when the dielectric layer 206 is made from the silicon oxide material and the silicon nitride material, the dielectric layer 206 can realize supporting of the first device structure layer and the electrical isolation between the silicon substrate 207 and the first device structure layer 211.

In some embodiments, the at least two device structure layers 210 and at least one conductive structure layer 212 are made of different materials as long as the at least one conductive structure layer 212 has a good conductivity performance. For example, the at least one conductive structure layer 212 is made from metal, and the at least two device structure layers 210 each are made from Epitaxy-polysilicon (Epi-polysilicon).

Alternatively, the at least two device structure layers 210 and the at least one conductive structure layer 212 are made of same materials. For example, all the device structure layers 210 and the at least one conductive structure layer 212 are made of polysilicon.

When the conductive structure layer 212 is made from the polysilicon, the electrical paths between the adjacent device structure layers 210 is formed, such that the performance of the MEMS device is not affected.

In some embodiments, the first device structure layer 211 has a thickness in a range of 10 um to 40 um, and the N-th device structure layer 213 has a thickness in a range of 2 um to 10 um.

In embodiments of the present disclosure, when the thickness of the first device structure layer 211 ranges from 10 um to 40 um, and the thickness of the N-th device structure layer 213 ranges from 2 um to 10 um, the first device structure layer 211 can be better support the N-th device structure layer 213, and the MEMS device formed may also be in an appropriate thickness range, such that the manufacturing cost and size of the MEMS device is reduced on the premise that the contact area of the removable structure of the MEMS devices is ensured.

In some embodiments, the recess 103 and the functional cavity 208 cooperatively define an enclosed cavity. The cap sheet 100 includes a first metal layer 101 outside the recess 103 and facing the device sheet 200. The device sheet 200 further includes a second metal layer disposed on a surface of the device structure layer 213 away from the silicon substrate and outside the functional portion 209. The second metal layer includes a first group of metal electrodes 204 close to the functional portion 209, and a second group of metal electrodes 205 around the first group of metal electrodes 204. The first group of metal electrodes 204 are configured for forming eutectic bonding with the first metal layer 101 on the cap sheet 100, and the second group of metal electrodes 205 are configured to output electric signal by gold wire bonding.

It is to be noted that the MEMS device needs to be operated in the sealed environment. Therefore, a cover body (e.g., the cap sheet described in the present disclosure) needs to be bonded with the device sheet 200. In embodiments of the present disclosure, the cap sheet 100 and the device sheet 200 are bonded via the first metal layer 101 and the first group of metal electrodes 204 of the device sheet 200, so that the corresponding movable structures of the MEMS device are disposed in the sealing cavity defined by the silicon substrate 1 and the cap sheet 100.

In addition, when the functional portion of the MEMS device generates electrical signals, the second metal layer can output electrical signals generated to external circuits.

In some embodiments, the first metal layer 101 and the second metal layer may be made from same materials or different materials. For example, the first metal layer is made from at least one of germanium (Ge), aluminium (Al), and aurum (Au), and the second metal layer is made from at least one of Ge, Al, and Au.

It is also to be noted that the device sheet 200 further includes a grounding portion (not shown) disposed at both sides of the first device structure layer 211. The grounding portion is mainly used for grounding. The grounding portion can be disposed on the silicon substrate because the dielectric layer 206 is patterned after deposition.

As can be seen, according to embodiments of the present disclosure, the MEMS device including the first movable structure 2011 configured to sense the angular velocity around Z-axis and the second movable structure 2031 configured to sense the angular velocity around X-axis and Y-axis is formed by stacking up the plurality of device structure layers 210 via the at least one conductive structure layer 212. The movable structure of the MEMS device has a relatively large contact area, i.e., electrodes of the MEMS structure are relatively wide and thick. The wide and thick electrodes have relatively high sensitivity and detection precision. Therefore, compared to traditional single layer device structure, the multi-layer device structure provided in the present disclosure gives benefit of reducing die size, reducing manufacturing cost of the device, and improving the integration of the device into portable consumer applications.

Figure 4:
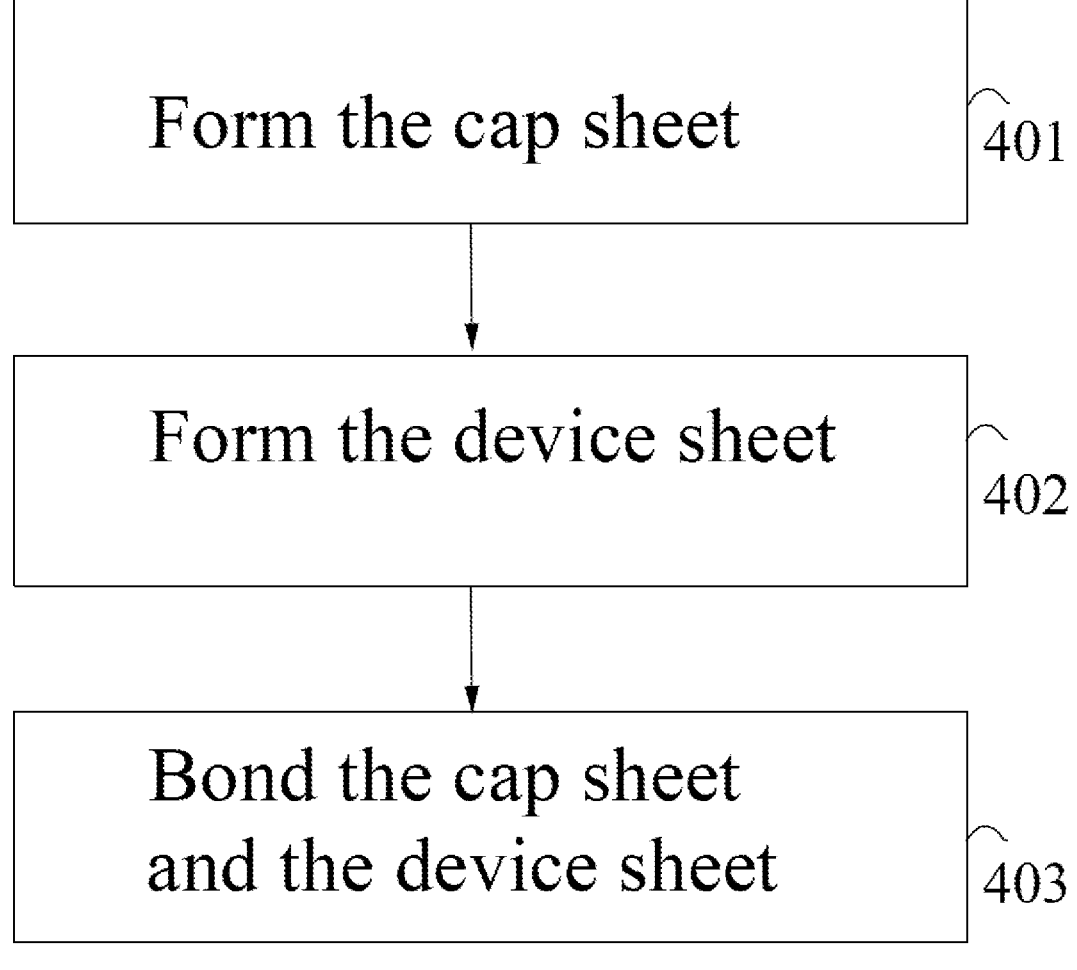
FIG. 4 is a flow chat of a method for manufacturing a MEMS device according to an embodiment of the present disclosure.

The following will describe a method for manufacturing the MEMS device illustrated in FIG. 2 of the present disclosure. FIG. 4 is a flow chat of a method for manufacturing a MEMS device according to embodiments of the present disclosure. FIGS. 5 to 9 are schematic structural views corresponding to each operation in the method for manufacturing the MEMS device. The following will be described in detail with reference to the accompanying drawings.

As illustrated in FIG. 4, the method for manufacturing the MEMS device is provided for manufacturing the MEMS device in foregoing embodiments. The method begins at block 401.

At block 401, the cap sheet 100 is formed.

At block 402, the device sheet 200 is formed.

At block 403, the cap sheet 100 and the device sheet 200 are bonded.

Since the MEMS device needs to be operated in a sealed environment, the cap sheet 100 is bonded with the device sheet 200, so that the corresponding movable structures of the MEMS device are sealed in the cavity defined by the silicon substrate 1 and the cap sheet 100. The cap device 100 is generally a silicon cap.

In some embodiments, the device sheet 200 is formed as follows. The silicon substrate 207 is provided. The functional portion 209 is formed by stacking up the at least two device structure layers 210 via the at least one conductive structure layer 212 in the first direction perpendicular to the surface of the silicon substrate. The at least two device structure layers 210 include the first device structure layer 211 close to the silicon substrate 207 and the N-th device structure layer 213 close to the cap sheet 100. N is a positive integer greater than or equal to 2.

It shall be understood that there is no restriction on the number of the device structure layers 210 and the conductive structure layer 212. Although the figures of the present disclosure merely illustrate two device structure layers 210 and one conductive structure layer 212, there may be three or more device structure layers stacked, as long as each two adjacent device structure layers 210 are coupled via a corresponding conductive structure layer 212.

The functional portion 209 is formed as follows.

Figure 5:
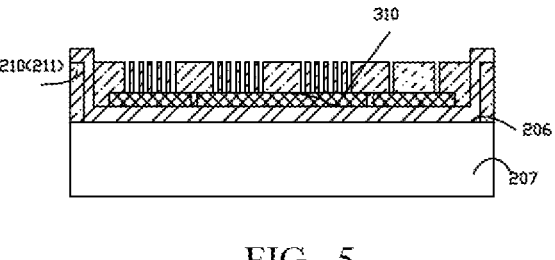
FIGS. 5 to 9 illustrate operations of the MEMS device according to some embodiments of the present disclosure.

As illustrated in FIG. 5, a first sacrificial layer 310 is deposited on a part of the surface of the silicon substrate 207 and the first sacrificial layer 310 in the second region 202 is patterned to define another part of the anchor point 2021 for the functional portion 209. The first device structure layer 211 is deposited on a surface of the first sacrificial layer 310 and the first device structure layer 211 in the first region 201 is patterned to form a part of the first movable structure in the first region 201 (i.e., two comb-like structures of the first device structure layer 211 in the first region 201).

Figure 6:
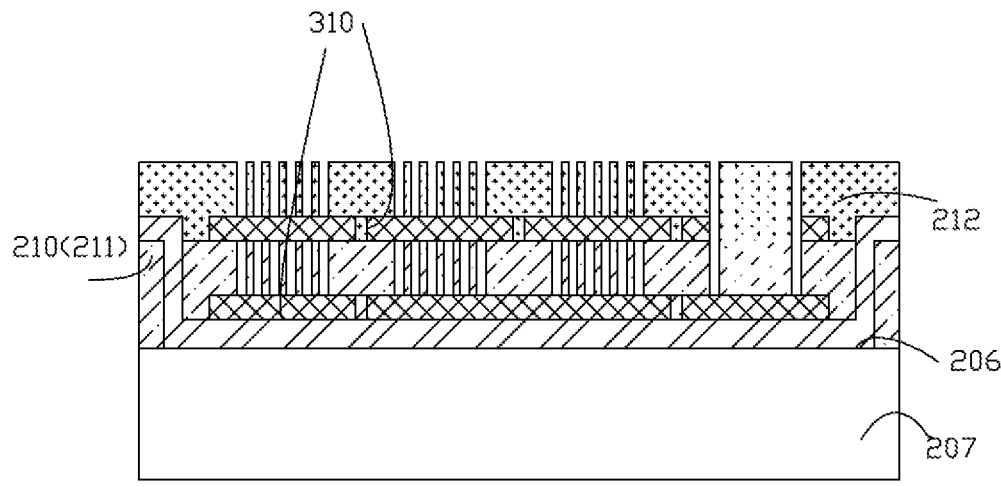

As illustrated in FIG. 6, a second sacrificial layer 310 is deposited on a part of a surface of the first device structure layer 211 in the first region 201 and the second region 202 and the second sacrificial layer in the second region 202 is patterned to define a part of the anchor point for the function portion 209. A first conductive structure layer 212 is deposited on a surface of the second sacrificial layer 310 and remaining part of the surface of the first device structure layer 211, and the first conductive structure layer 212 in the first region 201 is patterned to form another part of the first movable structure 2011 in the first region 201 (i.e., two comb-like structures of the first conductive structure layer 212 in the first region 201).

Figure 7:
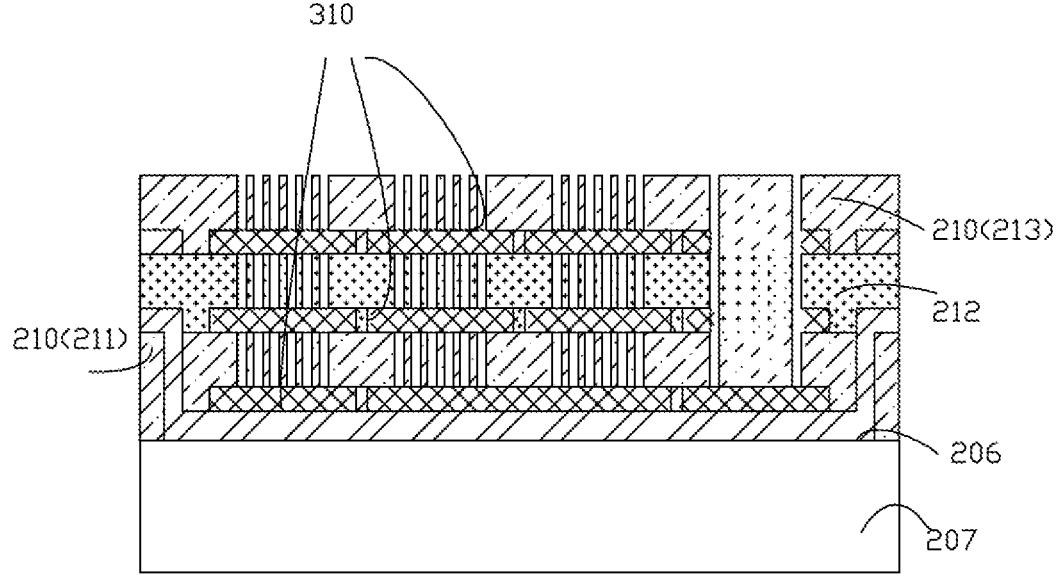

Referring to FIG. 7, a third sacrificial layer 310 is deposited on a part of a surface of the first conductive structure layer 212 in the first region 201 and the second region 202 and the third sacrificial layer 310 is patterned to define yet another part of the anchor point 2021 for the functional portion 209, and another device structure layer 210 is deposited on a surface of the third sacrificial layer 310 and another part of the surface of the first conductive structure layer 212 and the another device structure layer 210 is patterned to form yet another part of the first movable structure 2011 in the first region 201 (e.g., two comb-like structures of the another device structure layer 210 in the first region 201).

Continuing to referring to FIG. 7, operations of device-structure-layer deposition and patterning and conductive-structure-layer deposition and patterning are repeated, until the N-th device structure layer 213 is deposited and patterned.

Figure 8:
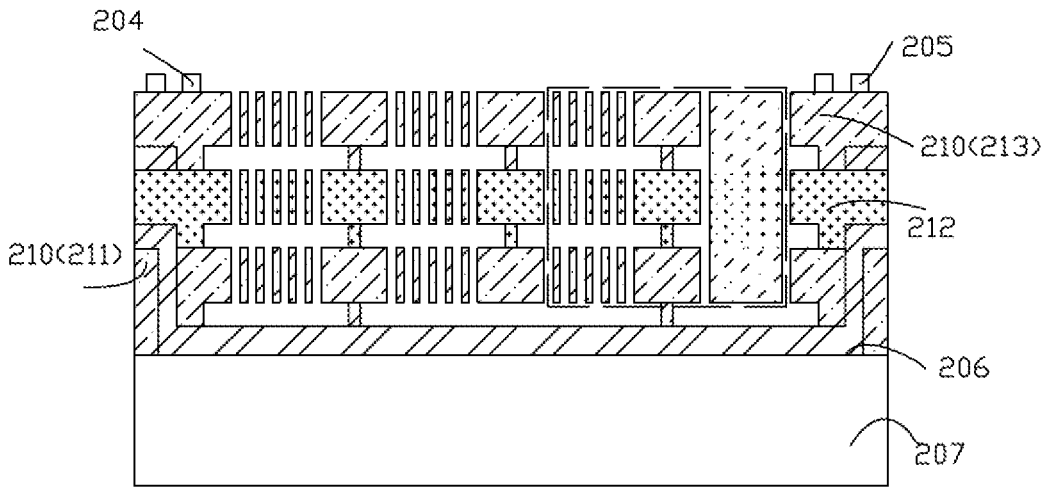
Figure 9:
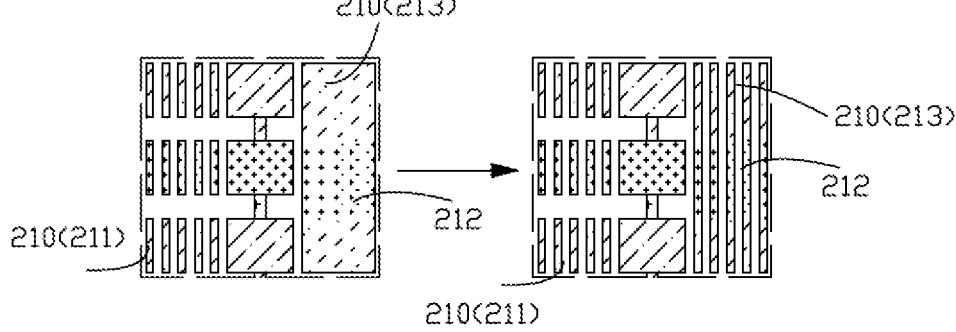

It shall be understood that the at least two device structure layers 210 are deposited by adopting Epitaxy-polysilicon and the at least one conductive structure layer 212 is deposited by adopting at least one of following materials: polysilicon and metal Referring to FIGS. 8 and 9, after the N-th device structure layer 213 is deposited and patterned, a deep reactive ion etching (DRIE) process is performed on the at least two device structure layers 210 and the at least one conductive structure layer 212 in the third region 203 to form the second movable structure 2031.

The DRIE process is to open the gap between each adjacent thick electrodes of the movable structure. Since the second movable structure 2031 is formed by combination of the multi-layer device structure layers, achieving a uniform profile of multi-layer electrodes can be challenging due to several factors: a) loading effects occur due to variations in the density being etched since there is multiple film stack being etch, which can result in a non-uniform profile; b) alignment issue if the DRIE process run individually for each layer. Therefore, in the present disclosure, after all the device structure layers are stacked, the DRIE process is performed on the combination of the device structure layers.

As illustrated in FIG. 8, in some embodiments, after forming the functional portion, the method further includes the following. All sacrificial layers 310 including the first sacrificial layer 310 and the second sacrificial layer 310 are removed by using vapor phase hydrofluoric acid (VHF).

It shall be understood that to provide oscillation space between the layers, gaps need to be reversed between adjacent layers. For example, the sacrificial layer 310 between the device structure layer 210 and the conductive structure layer 212 or the sacrificial layer 310 between the device structure layer 210 and the dielectric layer 206 (after the sacrificial layer 310 between the device structure layer 210 and the dielectric layer 206 is removed, the first space 320 is defined) need to be removed. Therefore, when the electrodes of the first movable structure 2011 in the first region 201 generates displacement, the distance between the electrodes of the adjacent layers is changed, so that the capacitance signal in the Z-axis direction can be detected.

In some embodiments, performing the DRIE process on the at least two device structure layers and the at least one conductive structure layer in the third region to form the second movable structure includes: forming two comb-like structures, wherein one of the two comb-like structures includes fixed beams, another of the two comb-like structures includes flexible beams, and beams of the two comb-like structures are alternately arranged, forming a forked finger arrangement.

In embodiments of the present disclosure, as illustrated in FIG. 8, the sacrificial layer between the device structure layer and the conductive structure layer or the sacrificial layer between the device structure layer and the dielectric layer is removed by adopting the VHF process to define the gap between the adjacent layers.

As illustrated in FIGS. 5 to 8, in some embodiments, the method further includes the following. Before depositing the first sacrificial layer 310, a dielectric layer 206 is deposited on the surface of the silicon substrate 207 by using at least one of a silicon oxide material and a silicon nitride material.

By depositing the dielectric layer 206 between the silicon substrate 207 and the first device structure layer 211, such that electrical isolation between the silicon substrate and the first device structure layer can be realized.

In some embodiments, depositing the first device structure layer includes depositing the first device structure layer of a thickness in a range of 10 um to 40 um, and depositing the N-th device structure layer includes depositing the N-th device structure layer of a thickness in a range of 2 um to 10 um In some embodiments, as illustrated in FIG. 8, after forming the functional portion 209, the method further includes the following. A second metal layer is formed on a surface of the N-th device structure layer 213 away from the silicon substrate 207, where the second metal layer is configured for forming eutectic bonding with the first metal layer 101 on the cap sheet 100 and forming electrical connection with external circuits.

In above embodiments, the MEMS device is fabricated by completing above-mentioned operations in a vacuum environment, thereby drying moisture and/or organic gas in the functional cavity 208, so as to keep operating performance of the MEMS device at a stable level and improve the operating reliability of the MEMS device and prolong service life of the MEMS device.

In some embodiments, the at least one conductive structure layer is made from at least one of polysilicon and metal, and the at least two device structure layers each are made from Epi-polysilicon.

It is to be noted that when the conductive structure layer 212 is made from the polysilicon, after the device structure layers 210 and the conductive structure layer 212 are patterned, the electrical path between the adjacent device structure layers 211 is formed, such that the performance of the MEMS device is not affected.

According to the method for manufacturing the MEMS device, since the MEMS device is formed by stacking up the at least two device structure layers 210 via the at least one conductive structure layer 212, the manufacturing process of the MEMS device is relatively simple and the MEMS device manufactured has the advantages described in the foregoing embodiments. In addition, since the second movable structure 2031 is formed by performing GRIE process after the multi-layer device structure are stacked via the at least one conductive structure layer 212, the electrodes in the second movable structure 2031 have uniform profile and are relatively thick, the uniform thick electrodes increase the sensitivity of the second movable structure 212, such that the sensitivity of the MEMS device in the X-axis and Y-axis can be improved.

This specification discloses one or more embodiments that incorporate the features of this disclosure. The disclosed embodiment(s) merely exemplify the present disclosure. The scope of the present disclosure is not limited to the disclosed embodiment(s). The present disclosure is defined by the claims appended hereto.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A micro electro mechanical system (MEMS) device, comprising:

a cap sheet defining a recess; and a device sheet bonded with the cap sheet and defining a functional cavity directly facing the recess; wherein the device sheet includes a silicon substrate and a functional portion received in the functional cavity, wherein the functional portion includes two device structure layers stacked in a first direction perpendicular to a surface of the silicon substrate, one conductive structure layer arranged between the two device structure layers, and a dielectric layer sandwiched between the silicon substrate and the device structure layer closer to the silicon substrate, and wherein the two device structure layers are coupled via the conductive structure layer to form electrical paths between the two adjacent device structure layers and the conductive structure layer; and the functional portion has a first region, a second region, and a third region, wherein the two device structure layers and the conductive structure layer each are across the first region, the second region, and the third region, and the two device structure layers and the conductive structure layer cooperatively form a first movable structure in the first region, define an anchor point in the second region, and form a second movable structure in the third region; and the first movable structure is configured to sense an angular velocity around Z-axis and the second movable structure is configured to sense an angular velocity around X-axis and Y-axis;

each layer of the two device structure layers and the conductive structure layer in the first region includes two comb-like structures, wherein one of the two comb-like structures includes fixed beams, another of the two comb-like structures includes movable beams, and beams of the two comb-like structures are alternately arranged, forming a forked finger arrangement;

the two comb-like structures of a respective device structure layer in the first region are separated from the two comb-like structures of the conductive structure layer in the first region, and the two comb-like structures of a device structure layer closer to the silicon substrate are separated from the dielectric layer by a first space.

2. The MEMS device of claim 1, wherein:

the two device structure layers and the conductive structure layer in the second region are connected with one another; and the anchor point is disposed at an end of the first movable structure and configured to support the first movable structure and connect the first movable structure to the electrical paths.

3. The MEMS device of claim 1, wherein:

the two device structure layers and the conductive structure layer in the third region are two comb-like structures, wherein one of the two comb-like structures includes fixed beams, another of the two comb-like structures includes movable beams, and beams of the two comb-like structures are alternately arranged, forming a forked finger arrangement; and the second movable structure has a thickness equal to a difference between a total thickness of the at least two device structure layers and the at least one conductive structure layer and a thickness of the first space in the first direction.

4. The MEMS device of claim 3, wherein there is an uniform opening defined between each two adjacent beams of the two comb-like structures.

5. The MEMS device of claim 1, wherein the conductive structure layer is made from at least one of polysilicon and metal, and the two device structure layers each are made from Epitaxy-polysilicon.

6. The MEMS device of claim 1, wherein the two device structure layers include a first device structure layer closer to the silicon substrate, wherein the dielectric layer sandwiched between the first device structure layer and the silicon substrate, and the dielectric layer is made from at least one of a silicon oxide material and a silicon nitride material.

7. The MEMS device of claim 1, wherein the cap sheet includes a first metal layer outside the recess and facing the device sheet, and the device sheet further includes a second metal layer, and wherein the cap sheet and the device sheet are bonded together via the first metal layer and the second metal layer.

8. The MEMS device of claim 7, wherein the first metal layer is made from at least one of germanium (Ge), aluminium (Al), and aurum (Au), and the second metal layer is made from at least one of Ge, Al, and Au.

9. The MEMS device of claim 7, wherein the functional portion is configured to generate electrical signals and the second metal layer is further configured to output electrical signals generated.

10. A method for manufacturing the MEMS device of claim 1, comprising:

forming the cap sheet;

forming the device sheet; and bonding the cap sheet and the device sheet;

wherein forming the device sheet includes:

providing the silicon substrate; and forming the functional portion in the functional cavity by stacking up the two device structure layers via the one conductive structure layer in the first direction perpendicular to the surface of the silicon substrate, wherein the two device structure layers include a first device structure layer closer to the silicon substrate and a second device structure layer closer to the cap sheet;

wherein forming the functional portion comprises:

depositing a first sacrificial layer on a part of the surface of the silicon substrate and patterning the first sacrificial layer in the second region to define the anchor point for the functional portion, and depositing the first device structure layer on a surface of the first sacrificial layer and patterning the first device structure layer in the first region to form a part of the first movable structure in the first region;

depositing a second sacrificial layer on a part of a surface of the first device structure layer in the first region and the second region and patterning the second sacrificial layer in the second region to define the anchor point for the function portion, and depositing a first conductive structure layer on a surface of the second sacrificial layer and another part of the surface of the first device structure layer and patterning the first conductive structure layer in the first region to form another part of the first movable structure in the first region;

performing a deep reactive ion etching (DRIE) process on the two device structure layers and the conductive structure layer in the third region to form the second movable structure; and removing all sacrificial layers including the first sacrificial layer and the second sacrificial layer by using vapor phase hydrofluoric acid (VHF).

11. The method of claim 10, wherein performing the DRIE process on the two device structure layers and the conductive structure layer in the third region to form the second movable structure includes:

forming two comb-like structures, wherein one of the two comb-like structures includes fixed beams, another of the two comb-like structures includes movable beams, and beams of the two comb-like structures are alternately arranged, forming a forked finger arrangement.

12. The method of claim 10, further comprising:

before depositing the first sacrificial layer, depositing a dielectric layer on the surface of the silicon substrate by using at least one of a silicon oxide material and a silicon nitride material.

13. The method of claim 10, wherein the two device structure layers are deposited by using Epitaxy-polysilicon and the conductive structure layer is deposited by using at least one of following materials: polysilicon and metal.

14. The method of claim 10, further comprising:

after forming the functional portion, forming a second metal layer on a surface of the second device structure layer, wherein the second metal layer is configured for forming eutectic bonding with a first metal layer on the cap sheet and forming electrical connection with external circuits.

* * * * *